US 11,920,932 B2

(12) United States Patent
Wu et al.

(10) Patent No.: US 11,920,932 B2
(45) Date of Patent: Mar. 5, 2024

(54) MICRO HEMISPHERICAL RESONATOR GYROSCOPE, AND AN ASSEMBLY METHOD AND WAFER FIXTURE

(71) Applicant: NATIONAL UNIVERSITY OF DEFENSE TECHNOLOGY, Changsha (CN)

(72) Inventors: Xuezhong Wu, Changsha (CN); Dingbang Xiao, Changsha (CN); Xiang Xi, Changsha (CN); Yulie Wu, Changsha (CN); Hanhui He, Changsha (CN); Yan Shi, Changsha (CN); Kun Lu, Changsha (CN); Bin Li, Changsha (CN); Yimo Chen, Changsha (CN); Chao Yuan, Changsha (CN); Bao Nie, Changsha (CN)

(73) Assignee: NATIONAL UNIVERSITY OF DEFENSE TECHNOLOGY, Changsha (CN)

( * ) Notice: Subject to any disclaimer, the term of this patent is extended or adjusted under 35 U.S.C. 154(b) by 429 days.

(21) Appl. No.: 17/298,597

(22) PCT Filed: Sep. 17, 2020

(86) PCT No.: PCT/CN2020/115926
§ 371 (c)(1),
(2) Date: May 30, 2021

(87) PCT Pub. No.: WO2021/093454
PCT Pub. Date: May 20, 2021

(65) Prior Publication Data
US 2022/0049959 A1    Feb. 17, 2022

(30) Foreign Application Priority Data
Nov. 13, 2019   (CN) .......................... 201911107509.5

(51) Int. Cl.
*G01C 19/5769* (2012.01)
*B81B 7/00* (2006.01)
(Continued)

(52) U.S. Cl.
CPC .......... *G01C 19/5769* (2013.01); *B81B 7/007* (2013.01); *G01C 19/5691* (2013.01);
(Continued)

(58) Field of Classification Search
CPC ............ G01C 19/5769; G01C 19/5691; G01C 19/5755; G01C 25/00; G01C 19/5783;
(Continued)

(56) References Cited

U.S. PATENT DOCUMENTS

2017/0016742 A1* 1/2017 Shkel ...................... G01C 25/00
2018/0188030 A1* 7/2018 Shang ................ G01C 19/5691
2020/0216311 A1* 7/2020 Najafi ................ C03B 23/0357

FOREIGN PATENT DOCUMENTS

CN          105698780 A  *  6/2016  ........... G01C 19/567

OTHER PUBLICATIONS

Machine translation of CN 105698780 (Year: 2016).*

* cited by examiner

*Primary Examiner* — J. E. Schoenholtz
(74) *Attorney, Agent, or Firm* — Bayramoglu Law Offices LLC

(57) ABSTRACT

A wafer-level assembly method for a micro hemispherical resonator gyroscope includes: after independently manufactured glass substrates are softened and deformed at a high temperature, forming a micro hemispherical resonator on the glass substrate; forming glass substrate alignment holes at both ends of the glass substrate by laser ablation; aligning and fixing a plurality of identical micro hemispherical resonators on a wafer fixture by using the alignment holes as (Continued)

a reference, and then performing operations by using the wafer fixture as a unit to implement subsequent processes that include: releasing the micro hemispherical resonators, metallizing the surface, fixing to the planar electrode substrates, separating the wafer fixture and cleaning to obtain a micro hemispherical resonator gyroscope driven by a bottom planar electrode substrate. The wafer-level assembly method includes: fixedly mounting the plurality of independently manufactured micro hemispherical resonators on the same wafer fixture to implement a wafer-level installation operation.

13 Claims, 3 Drawing Sheets

(51) Int. Cl.
*G01C 19/5691* (2012.01)
*G01C 19/5755* (2012.01)
*G01C 25/00* (2006.01)

(52) U.S. Cl.
CPC ......... *G01C 19/5755* (2013.01); *G01C 25/00* (2013.01); *B81B 2201/0242* (2013.01); *B81B 2201/0271* (2013.01)

(58) Field of Classification Search
CPC ............ B81B 7/007; B81B 2201/0242; B81B 2201/0271; B81C 3/001
See application file for complete search history.

MICRO HEMISPHERICAL RESONATOR GYROSCOPE, AND AN ASSEMBLY METHOD AND WAFER FIXTURE

CROSS REFERENCE TO THE RELATED APPLICATIONS

This application is the national phase entry of International Application No. PCT/CN2020/115926, filed on Sep. 17, 2020, which is based upon and claims priority to Chinese Patent Application No. 201911107509.5, filed on Nov. 13, 2019, the entire contents of which are incorporated herein by reference.

TECHNICAL FIELD

The present invention relates to the technical field of microelectromechanical system manufacturing, and in particular to a micro hemispherical resonator gyroscope, an assembly method for the micro hemispherical resonator gyroscope, and a wafer fixture for the micro hemispherical resonator gyroscope.

BACKGROUND

A gyroscope is a sensor that measures the angular movement of a carrier in the inertial space. As essential core devices of inertial navigation and attitude measurement systems, gyroscopes have important application values in the fields such as precision guidance, unmanned systems, petroleum exploration, stabilized platforms, and space vehicles.

As a member of gyroscopes, the resonator gyroscope has been widely used due to its advantages of fewer parts, high reliability and long lifetime. Micro hemispherical resonator gyroscopes are novel resonator gyroscopes and typically manufactured using techniques including micro hemispherical resonator manufacturing, electrode assembly, vacuum-packaging and measurement and control circuits. The electrodes of micro hemispherical resonator gyroscopes are structurally divided into arc-shaped electrodes and sidewall electrodes and bottom planar electrodes. The arc-shaped electrodes are highly sensitive to both axial and radial assembly deviation. The sidewall electrodes are also highly sensitive to radial deviation. The bottom planar electrodes are only highly sensitive to axial deviation and have an electrode arrangement form that has the minimum assembly difficulty and is thus the easiest for mass production. Geometric imperfections and electrode assembly deviation of the micro hemispherical resonators are the basic sources of output errors for gyroscope.

At present, the micro hemispherical resonator processed by the micro-glassblowing process can basically meet the application requirements of the gyroscope, but the high-precision assembly technique still desires improved assembly efficiency, stability and consistency, and thus remains an important factor in restricting the development of micro hemispherical resonator gyroscopes.

SUMMARY

In order to overcome the problems of low assembly accuracy, poor assembly consistency, and low assembly efficiency of the existing assembly techniques for micro hemispherical resonator gyroscopes, the present invention provides a wafer-level assembly method for a micro hemispherical resonator gyroscope based on a bottom planar electrodes architecture, which significantly improves the assembly accuracy, consistency, stability and efficiency.

To solve the above-mentioned technical problems, the present invention is implemented through the following technical solutions. A wafer-level assembly method for a micro hemispherical resonator gyroscope includes the following steps:

step 1, forming at least two through glass substrate alignment holes at the edges of both ends of each of a plurality of glass substrates with micro hemispherical resonators;

step 2, aligning the plurality of glass substrates obtained after being processed in step 1 with a wafer fixture, respectively, and fixing the plurality of glass substrates on the wafer fixture by performing alignment using an alignment pin and applying a pressure using a flat plate;

step 3, removing the flat plate and the alignment pin sequentially, and performing a removal processing on the glass substrates to obtain the plurality of micro hemispherical resonators fixed on the wafer fixture;

step 4, after the overall structure obtained in step 3 is cleaned, coating the entire surface of the wafer fixture to add at least one metal film on the inner concave surface of each micro hemispherical resonator;

step 5, placing the wafer fixture on which the plurality of micro hemispherical resonators are mounted in parallel with an electrode jig wafer on which a plurality of planar electrode substrates are fixed, and fixedly connecting the micro hemispherical resonators to the planar electrode substrates after alignment;

step 6, releasing the fixed connection between the micro hemispherical resonator and a fixed cylinder, and the fixed connection between the planar electrode substrate and the electrode jig wafer, respectively, and sequentially removing the wafer fixture and the electrode jig wafer; and step 7, cleaning the overall structure obtained in step 6 to obtain the micro hemispherical resonator gyroscope.

Further, step 2 further includes:

step 21, applying glue on the fixed cylinder, aligning and placing the glass substrates on the wafer fixture to fix the glass substrates on the wafer fixture;

step 22, before the glue is cured, aligning the glass substrate alignment holes on the glass substrate with fixture positioning holes on the wafer fixture, and inserting the alignment pin to implement the alignment; and step 23, after the plurality of glass substrates are mounted on the wafer fixture, applying a pressure on the glass substrates toward one side of the wafer fixture by using the flat plate with holes to completely fix and attach the glass substrates to the wafer fixture.

Further, step 5 further includes:

step 51, fixedly attaching a prepared planar electrode substrate wafer to the electrode jig wafer; and step 52, separating the planar electrode substrate wafer into a plurality of planar electrode substrates by means of laser ablation, so that the rear surface of the planar electrode substrate is fixed to the electrode jig wafer, and the front surface of the planar electrode substrate forms a separate unit structure.

Further, the glass substrates and the wafer fixture are fixedly connected by means of gluing. The planar electrode substrates and the electrode jig wafer are fixedly connected by means of gluing or bonding. The micro hemispherical resonators and the planar electrode substrates are fixedly connected by means of any one of gluing, bonding and welding.

Further, the glass substrate alignment holes are formed by means of laser ablation, and the removal processing on the glass substrates is implemented by means of laser ablation or chemical etching.

Further, the micro hemispherical resonators, the planar electrode substrates and the wafer fixture are all made of fused silica.

The present invention further provides a micro hemispherical resonator gyroscope, including a micro hemispherical resonator. The micro hemispherical resonator is fixedly connected to a planar electrode substrate through a central anchor, and the planar electrode substrate is configured to extract a vibration signal from the micro hemispherical resonator gyroscope.

A gap is provided between both ends of the micro hemispherical resonator and the planar electrode substrate and the gap is configured to implement electrostatic actuation and capacitive detection of the micro hemispherical resonator gyroscope.

Further, the geometric center of the micro hemispherical resonator coincides with the geometric center of the planar electrode substrate, and the micro hemispherical resonator gyroscope is manufactured by the wafer-level assembly method for the micro hemispherical resonator gyroscope as described above.

The present invention further provides a wafer fixture for a micro hemispherical resonator, including a fixture body. The fixture body is provided with a plurality of clearance trenches matched with the micro hemispherical resonator, and each of both sides of the clearance trench is provided with a guide trench.

The geometric center of each clearance trench is provided with a fixed cylinder configured to fix the micro hemispherical resonator, and the height of the fixed cylinder is equal to the depth of the clearance trench.

The periphery of each clearance trench is provided with two fixture positioning holes. The two fixture positioning holes are symmetric with respect to the geometric center of the clearance trench and configured to position the micro hemispherical resonator on the wafer fixture.

Further, the shape of the wafer fixture is any one of a circle, an oval and a regular polygon.

Compared with the prior art, the present invention has the following advantages.

1. According to the present invention, the wafer-level assembly method for the micro hemispherical resonator gyroscope includes: aligning and mounting a plurality of glass substrates with micro hemispherical resonators on a wafer fixture, releasing the micro hemispherical resonators, metallizing the surface and assembling planar electrode substrates; and fixedly mounting a plurality of independently manufactured micro hemispherical resonators on the same wafer fixture to accomplish a wafer-level installation operation, which significantly reduces assembly errors of the micro hemispherical resonator gyroscope while improving the stability, consistency and assembly efficiency of the process.

2. The micro hemispherical resonator gyroscope provided by the present invention is a gyroscope structure based on a bottom planar electrodes architecture, which has low assembly difficulty and thus is easy to mass produce. A plurality of micro hemispherical resonators are positioned once being aligned and fixed with the planar electrode substrates, thus greatly improving the assembly efficiency and consistency of the process. Moreover, the plurality of micro hemispherical resonators eliminate some errors through mutual cancellation to finally reduce assembly errors of the micro hemispherical resonator gyroscope.

3. The wafer fixture for the micro hemispherical resonator provided by the present invention is fixed on the inner side of an anchor of the micro hemispherical resonator to ensure a sufficient contact area between the micro hemispherical resonator and the wafer fixture while realizing compatibility for subsequent technological processes. The high-precision alignment holes on the wafer fixture for the micro hemispherical resonator ensure a sufficient installation accuracy of the micro hemispherical resonator and the wafer fixture, while significantly improving the alignment accuracy and consistency of subsequent processes of the micro hemispherical resonator.

BRIEF DESCRIPTION OF THE DRAWINGS

In order to more clearly illustrate embodiments of the present invention or technical solutions in the prior art, the drawings used in the description of the embodiments or prior art are briefly introduced below. Obviously, the drawings in the following description are merely some embodiments of the present invention, and for those ordinarily skilled in the art, other drawings may also be obtained according to structures shown in these drawings without creative efforts.

The present invention will be further explained below with reference to the drawings.

Figure 1:
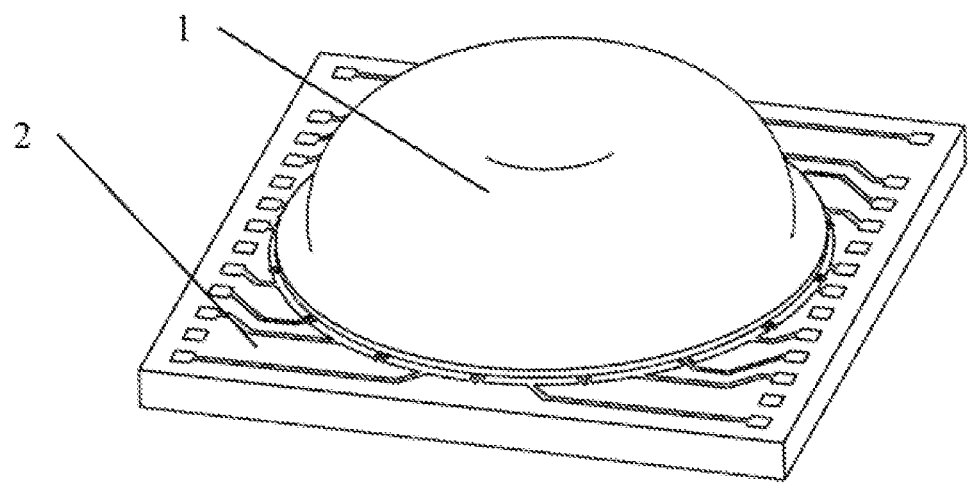
FIG. 1 is a structural schematic diagram of a micro hemispherical resonator gyroscope of the present invention.
Figure 2:
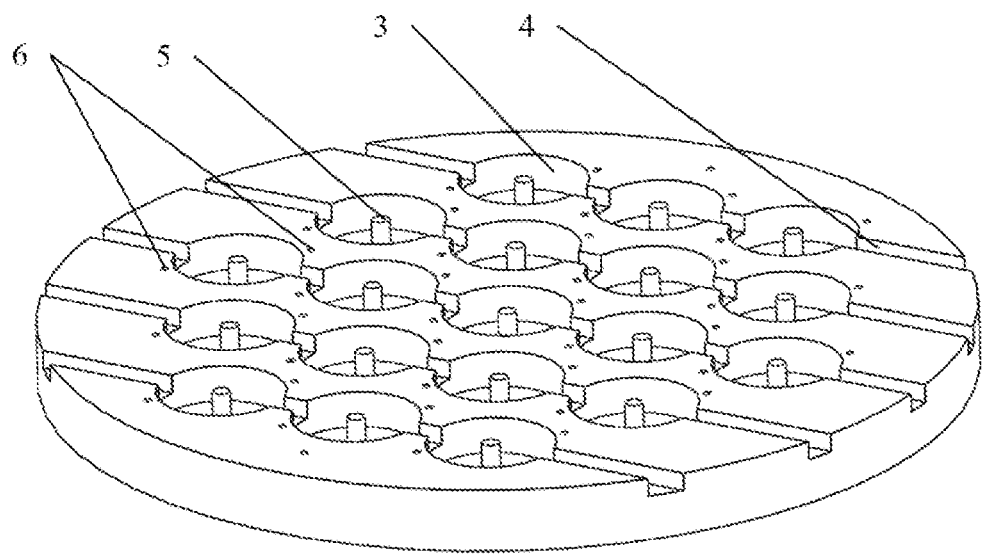
FIG. 2 is a structural schematic diagram of a wafer fixture for the present invention.

1. micro hemispherical resonator; 2. planar electrode substrate; 3. clearance trench; 4. guide trench; 5. fixed cylinder; 6. fixture positioning hole; 7. flat plate; 8. glass substrate; 9. glass substrate alignment hole; 10. wafer fixture; 11. metal film; 12. electrode jig wafer; and 13. alignment pin.

DETAILED DESCRIPTION OF THE EMBODIMENTS

The technical solutions in the embodiments of the present invention will be clearly and completely illustrated below with reference to the drawings in the embodiments of the present invention. Obviously, the described embodiments are only part of the embodiments of the present invention, rather than all the embodiments. Based on the embodiments of the present invention, all other embodiments obtained by those ordinarily skilled in the art without creative efforts shall fall within the scope of protection of the present invention.

It should be noted that all directional indications (such as up, down, left, right, front, rear . . . ) in the embodiments of the present invention are only used to explain relative positional relationships, movements and the like between the components in a specific posture (as shown in the drawings), and if the specific posture changes, the directional indications also change accordingly.

In addition, the description of "first", "second" and the like in the present invention are only used for descriptive purposes and cannot be construed as indicating or implying relative importance or implying the number of the indicated technical features. Thus, features defined with "first" "second" and like may explicitly or implicitly include at least one of the features. In the description of the present invention, "a plurality of" means at least two, e.g., two, three, etc., unless otherwise expressly and specifically defined.

In the present invention, the terms "connect", "fix" and the like should be understood in a broad sense, unless otherwise expressly specified and limited. For example, "fix" may indicate a fixed connection, a detachable connection, or an integral connection; "connect" may indicate a mechanical connection, an electrical connection, a physical connection or a wireless communication connection; it can be a direct connection, or an indirect connection through an intermediate medium, or it can be an internal connection between two elements or an interactive relationship between two elements, unless otherwise clearly defined. For those ordinarily skilled in the art, the specific meanings of the above terms in the present invention will be understood according to the specific circumstances.

In addition, the technical solutions between various embodiments of the present invention can be combined with each other, but must be implementable by those ordinarily skilled in the art. When the combination of technical solutions is contradictory or cannot be implemented, it should be considered that the combination of such technical solutions does not exist and is not within the scope of protection claimed by the present invention.

Embodiment 1

Figure 3A:
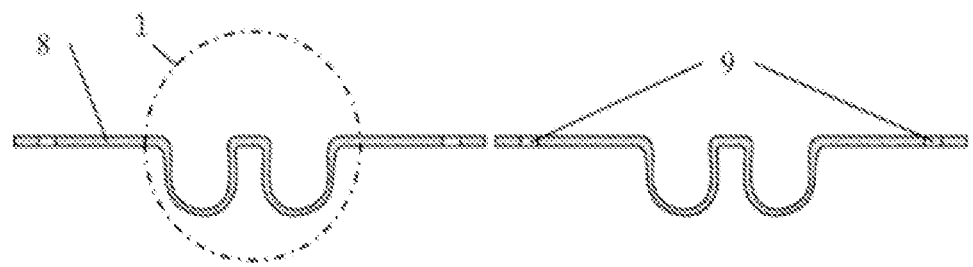
FIGS. 3A-3G are cross-sectional views showing a flow chart of a wafer-level assembly method for the micro hemispherical resonator gyroscope of the present invention.

As shown in FIGS. 3A-3G, a wafer-level assembly method for a micro hemispherical resonator gyroscope is suitable for a high-precision assembly of a micro hemispherical resonator gyroscope driven by a bottom planar electrode substrate, and specifically includes the following steps:

Step 1, as shown in FIG. 3A, at least two through glass substrate alignment holes 9 are formed at the edges of both ends of each of a plurality of glass substrates 8 with the micro hemispherical resonators 1 and configured to position the micro hemispherical resonator 1 on the wafer fixture 10. In the present embodiment, the two glass substrate alignment holes 9 are symmetrically formed with respect to the central axis of the glass substrate 8 by means of laser ablation.

Figure 3B:
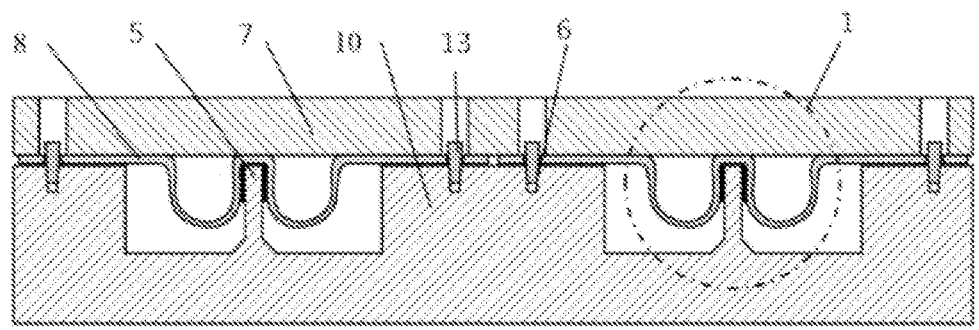

Step 2, as shown in FIG. 3B, the plurality of glass substrates 8 obtained after being processed in step 1 are aligned with the wafer fixture 10 by using the glass substrate alignment holes 9 as a reference, respectively. A plurality of alignment pins 13 are inserted into the fixture positioning holes 6 sequentially to position and fix the glass substrates 8. Then, the flat plate 7 covers one end of the glass substrates away from the wafer fixture 10 and applies a pressure on the glass substrates to fix the glass substrate 8 on the wafer fixture 10, so as to accomplish a wafer-level installation operation, which significantly reduces assembly errors of the micro hemispherical resonator gyroscope and improves the stability, consistency of the process, while greatly improving the assembly efficiency. In addition, the plurality of micro hemispherical resonators 1 can eliminate some errors through mutual cancellation to finally reduce the assembly errors of the micro hemispherical resonator gyroscope.

Further, step 2 further includes:
step 21, glue is applied on the fixed cylinder 5, the glass substrates 8 are aligned and placed on the wafer fixture 10 to fix the glass substrates 8 on the wafer fixture 10;

step 22, before the glue is cured completely, the glass substrate alignment holes 9 on the glass substrate 8 are aligned with the fixture positioning holes 6 on the wafer fixture 10, and the alignment pin 13 is inserted to position and fix the glass substrates 8 on the wafer fixture; and step 23, after the plurality of glass substrates 8 are all mounted on the wafer fixture 10 according to the above method, a pressure is applied on the glass substrates 8 toward one side of the wafer fixture 10 by using the flat plate 7 with holes, the holes on the flat plate 7 are aligned with the glass substrate alignment holes 9 to completely fix and attach the glass substrates 8 to the wafer fixture 10.

Figure 3C:
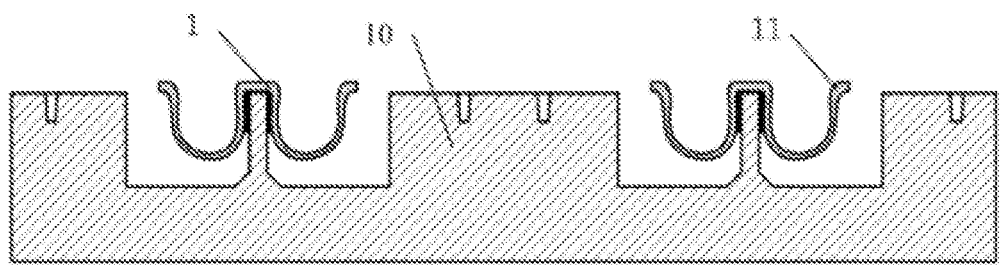

Step 3, as shown in FIG. 3C, the flat plate 7 and the alignment pin 13 are sequentially removed, and a removal processing is performed on the glass substrates 8 to obtain a plurality of individual micro hemispherical resonators 1 fixed on the wafer fixture 10. Other parts of the structure excluding the micro hemispherical resonators are removed. In the present embodiment, the removal processing on the glass substrate 8 is implemented by means of laser ablation or chemical etching.

Step 4, as shown in FIG. 3C, after the integral structure composed of the wafer fixture 10 and the plurality of micro hemispherical resonators 1 obtained in step 3 is cleaned, the entire surface of the wafer fixture 10 is coated to add at least one metal film 11 on the inner concave surface of each micro hemispherical resonator 1 to metallize the surface of the micro hemispherical resonator. In the present embodiment, the metal film 11 has one layer and is made of metal with good electrical conductivity, and the specific material is not limited.

Figure 3D:
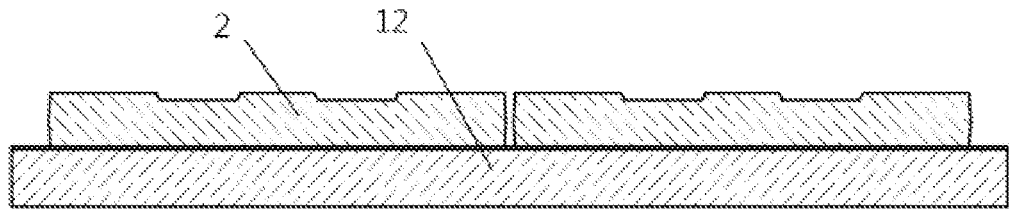
Figure 3E:
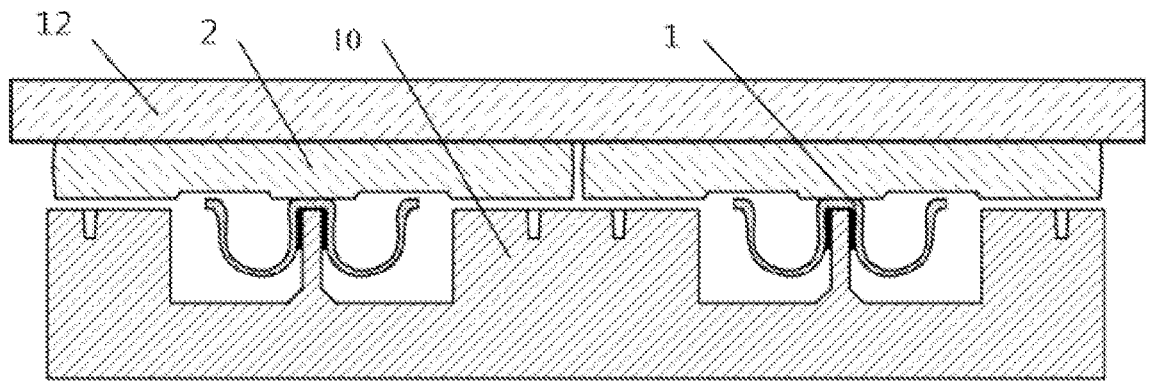

Step 5, as shown in FIG. 3E, the wafer fixture 10 on which the plurality of micro hemispherical resonators 1 are mounted is placed in parallel with the electrode jig wafer 12 on which a plurality of planar electrode substrates 2 are fixed, and the micro hemispherical resonators 1 are fixedly connected to the planar electrode substrates 2 after alignment.

Further, step 5 further includes:
step 51, the prepared planar electrode substrate wafer is fixedly attached to the electrode jig wafer 12; and step 52, as shown in FIG. 3D, the planar electrode substrate wafer is separated into a plurality of planar electrode substrates 2 by means of laser ablation, so that the rear surface of the planar electrode substrate 2 is fixed to the electrode jig wafer 12, and the front surface of the planar electrode substrate 2 forms a separate unit structure.

Figure 3F:
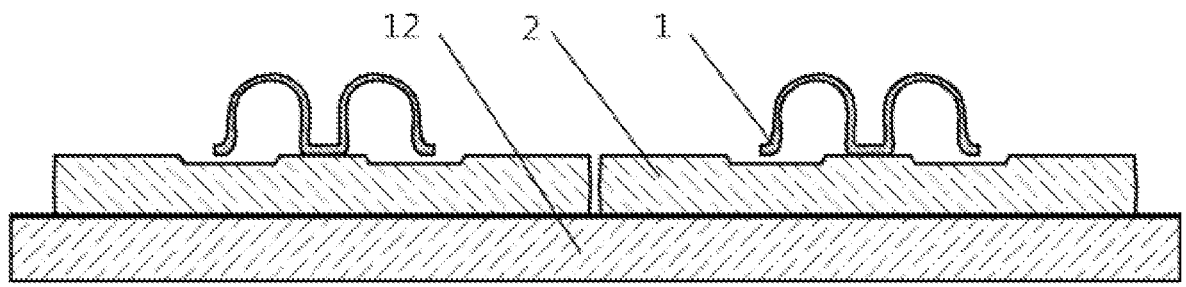
Figure 3G:
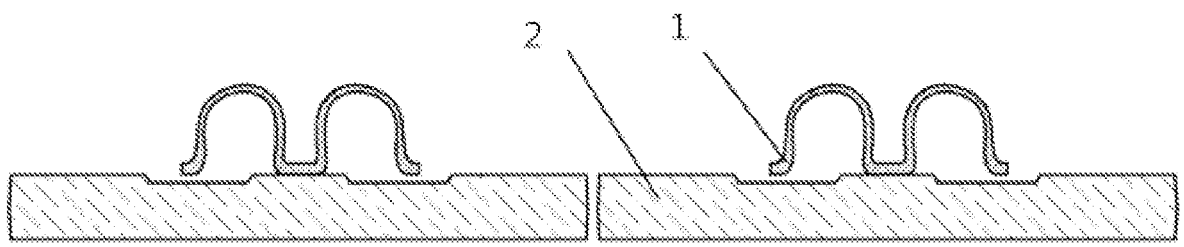

Step 6, as shown in FIG. 3F and FIG. 3G, after the micro hemispherical resonators 1 and the planar electrode substrates 2 are completely fixed, the fixed connection between the micro hemispherical resonator 1 and the fixed cylinder 5, and the fixed connection between the planar electrode substrate 2 and the electrode jig wafer 12 are released, respectively, and the wafer fixture 10 and the electrode jig wafer 12 are sequentially removed.

Step 7, the overall structure composed of the micro hemispherical resonators 1 and the planar electrode substrates 2 obtained in step 6 is cleaned to obtain the micro hemispherical resonator gyroscope.

Preferably, the glass substrates 8 and the wafer fixture 10 are fixedly connected by means of gluing. The planar electrode substrates 2 and the electrode jig wafer 12 are fixedly connected by means of gluing or bonding, preferably gluing. The micro hemispherical resonator 1 and the planar electrode substrates 2 are fixedly connected by means of any one of gluing, bonding and welding, preferably gluing.

When all the components are fixed by gluing, the complexity of each process is reduced while diminishing the cost during assembly.

Preferably, the micro hemispherical resonator 1, the planar electrode substrates 2 and the wafer fixture 10 are all made of fused silica, that is, made of the same material to minimize deformation errors caused by a thermal mismatch between the micro hemispherical resonator and the planar electrode substrate wafer during assembly.

Embodiment 2

A micro hemispherical resonator gyroscope shown in FIG. 1, and FIGS. 3A-3G includes the micro hemispherical resonator 1, and the micro hemispherical resonator 1 is fixedly connected to the planar electrode substrate 2 through a central anchor to ensure a sufficient contact area between the micro hemispherical resonator 1 and the wafer fixture 10 while realizing compatibility for subsequent technological processes. The planar electrode substrate 2 is configured to extract a vibration signal from the micro hemispherical resonator gyroscope and is an essential component of the micro hemispherical resonator gyroscope.

A gap is provided between both ends of the micro hemispherical resonator 1 and the planar electrode substrate 2. The gap is formed by grooves provided at positions of the planar electrode substrate 2 corresponding to both ends of the micro hemispherical resonator 1 and configured to implement electrostatic actuation and capacitive detection of the micro hemispherical resonator gyroscope.

Preferably, the geometric center of the micro hemispherical resonator 1 coincides with the geometric center of the planar electrode substrate 2 to ensure the high-precision and normal use of the micro hemispherical resonator gyroscope. The micro hemispherical resonator gyroscope is manufactured by the wafer-level assembly method for the micro hemispherical resonator gyroscope as described in embodiment 1, and the manufacturing process includes the following steps:

step 1, at least two through glass substrate alignment holes 9 are formed at the edges of both ends of each of a plurality of glass substrates 8 with the micro hemispherical resonators 1;

step 2, the plurality of glass substrates 8 obtained after being processed in step 1 are aligned with the wafer fixture 10, respectively, and the plurality of glass substrates 8 are fixed on the wafer fixture 10 by performing alignment using the alignment pin 13 and applying a pressure using the flat plate 7;

step 3, the flat plate 7 and the alignment pin 13 are removed sequentially, and a removal processing is performed on the glass substrates 8 to obtain a plurality of micro hemispherical resonators 1 fixed on the wafer fixture 10;

step 4, after the overall structure obtained in step 3 is cleaned, the entire surface of the wafer fixture 10 is coated to add at least one metal film 11 on the inner concave surface of each micro hemispherical resonator 1;

step 5, the wafer fixture 10 on which the plurality of micro hemispherical resonators 1 are mounted are placed in parallel with the electrode jig wafer 12 on which a plurality of planar electrode substrates 2 are mounted, and the micro hemispherical resonators 1 are fixedly connected to the planar electrode substrates 2 after alignment;

step 6, the fixed connection between the micro hemispherical resonator 1 and the fixed cylinder 5, and the fixed connection between the planar electrode substrate 2 and the electrode jig wafer 12 are released, respectively, and the wafer fixture 10 and the electrode jig wafer 12 are sequentially removed; and step 7, the overall structure obtained in step 6 is cleaned to obtain the micro hemispherical resonator gyroscope.

Embodiment 3

A wafer fixture for the micro hemispherical resonator shown in FIG. 2, and FIGS. 3A-3G includes a fixture body. The fixture body is provided with a plurality of clearance trenches 3 matched with the micro hemispherical resonator 1. Each of both sides of the clearance trench 3 is provided with the guide trench 4 configured for allowing an inflow and outflow of the gas and/or liquid and waste gas and/or waste liquid required in the assembly process to ensure normal processing.

The geometric center of each clearance trench 3 is provided with the fixed cylinder 5, that is, one clearance trench 3 is correspondingly provided with one fixed cylinder 5 therein, configured to fix the micro hemispherical resonator 1. The height of the fixed cylinder 5 is equal to the depth of the clearance trench 3 to facilitate applying a pressure on the glass substrates 8 by using the flat plate 7 after the glass substrates 8 are placed.

The periphery of each clearance trench 3 is provided with two fixture positioning holes 6. The two fixture positioning holes 6 are symmetric with respect to the geometric center of the clearance trench and configured to position the micro hemispherical resonators 1 on the wafer fixture 10. The high-precision alignment hole ensures a sufficient installation accuracy of the micro hemispherical resonators and the wafer fixture while significantly improving the alignment accuracy and consistency of subsequent processes of the micro hemispherical resonators.

Preferably, the shape of the wafer fixture 10 is any one of a circle, an oval and a regular polygon, and is preferably a circle to facilitate the wafer-level assembly operation.

The above descriptions are only the preferred embodiments of the present invention and do not limit the scope of the claims of the present invention. Equivalent structural transformations made based on the inventive concept of the present invention using the contents of the description and the drawings, or direct/indirect application in other related technical fields shall fall within the scope of protection of the present invention.

What is claimed is:

1. A wafer-level assembly method for a micro hemispherical resonator gyroscope, comprising the following steps:
   step 1, forming at least two through glass substrate alignment holes at edges of each glass substrate of a plurality of glass substrates with a plurality of micro hemispherical resonators;
   step 2, aligning the plurality of glass substrates obtained after being processed in step 1 with a wafer fixture, respectively, and fixing the plurality of glass substrates on the wafer fixture by using an alignment pin to align the plurality of glass substrates and applying a pressure by using a flat plate;
   step 3, removing the flat plate and the alignment pin sequentially, and performing a removal processing on the plurality of glass substrates to obtain the plurality of micro hemispherical resonators fixed on the wafer fixture;
   step 4, after an overall structure of the wafer fixture and the plurality of micro hemispherical resonators obtained in step 3 is cleaned, coating an entire surface of the wafer fixture to add at least one metal film on an inner concave surface of each micro hemispherical resonator of the plurality of micro hemispherical resonators;

step 5, placing the wafer fixture in parallel with an electrode jig wafer, wherein the plurality of micro hemispherical resonators are mounted on the wafer fixture and a plurality of planar electrode substrates are fixed on the electrode jig wafer, and fixedly connecting the plurality of micro hemispherical resonators to the plurality of planar electrode substrates after an alignment;

step 6, releasing a fixed connection between the each micro hemispherical resonator and a fixed cylinder, and a fixed connection between the plurality of planar electrode substrates and the electrode jig wafer, respectively, and sequentially removing the wafer fixture and the electrode jig wafer; and step 7, cleaning an overall structure of the plurality of micro hemispherical resonators and the plurality of planar electrode substrates obtained in step 6 to obtain the micro hemispherical resonator gyroscope.

2. The wafer-level assembly method according to claim 1, wherein
step 2 further comprises:
step 21, applying glue on the fixed cylinder, aligning and placing the plurality of glass substrates on the wafer fixture to fix the plurality of glass substrates on the wafer fixture;
step 22, before the glue is cured, aligning the at least two through glass substrate alignment holes on the each glass substrate with fixture positioning holes on the wafer fixture, and inserting the alignment pin to align the plurality of glass substrates; and
step 23, after the plurality of glass substrates are mounted on the wafer fixture, applying the pressure on the plurality of glass substrates toward one side of the wafer fixture by using the flat plate with holes to completely fix and attach the plurality of glass substrates to the wafer fixture.

3. The wafer-level assembly method according to claim 1, wherein
step 5 further comprises:
step 51, fixedly attaching a prepared planar electrode substrate wafer to the electrode jig wafer; and
step 52, separating the prepared planar electrode substrate wafer into the plurality of planar electrode substrates by means of laser ablation, wherein a rear surface of each planar electrode substrate of the plurality of planar electrode substrates is fixed to the electrode jig wafer and a front surface of the each planar electrode substrate forms a separate unit structure.

4. The wafer-level assembly method according to claim 1, wherein
the plurality of glass substrates and the wafer fixture are fixedly connected by means of gluing;
the plurality of planar electrode substrates and the electrode jig wafer are fixedly connected by means of the gluing or bonding; and
the plurality of micro hemispherical resonators and the plurality of planar electrode substrates are fixedly connected by means of any one of the gluing, the bonding and welding.

5. The wafer-level assembly method according to claim 4, wherein
the at least two through glass substrate alignment holes are formed by means of laser ablation, and the removal processing on the plurality of glass substrates is implemented by means of the laser ablation or chemical etching.

6. The wafer-level assembly method according to claim 1, wherein
the plurality of micro hemispherical resonators, the plurality of planar electrode substrates and the wafer fixture are all made of fused silica.

7. A micro hemispherical resonator gyroscope, comprising
a micro hemispherical resonator, wherein
the micro hemispherical resonator is fixedly connected to a planar electrode substrate-through a central anchor, and the planar electrode substrate is configured to extract a vibration signal from the micro hemispherical resonator gyroscope;
a gap is provided between both ends of the micro hemispherical resonator and the planar electrode substrate and the gap is configured to implement an electrostatic actuation and capacitive detection of the micro hemispherical resonator gyroscope; and
a geometric center of the micro hemispherical resonator coincides with a geometric center of the planar electrode substrate, and the micro hemispherical resonator gyroscope is manufactured by the wafer-level assembly method of claim 1.

8. A wafer fixture for a micro hemispherical resonator, comprising a fixture body;
wherein
the fixture body is provided with a plurality of clearance trenches matched with the micro hemispherical resonator, and each of both sides of each clearance trench of the plurality of clearance trenches is provided with a guide trench;
a geometric center of the each clearance trench is provided with a fixed cylinder configured to fix the micro hemispherical resonator, and a height of the fixed cylinder is equal to a depth of the each clearance trench; and
a periphery of the each clearance trench is provided with two fixture positioning holes;
the two fixture positioning holes are symmetric with respect to the geometric center and configured to position the micro hemispherical resonator on the wafer fixture.

9. The wafer fixture according to claim 8, wherein
a shape of the wafer fixture is one selected from the group consisting of a circle, an oval and a regular polygon.

10. The wafer-level assembly method according to claim 2, wherein
the plurality of micro hemispherical resonators, the plurality of planar electrode substrates and the wafer fixture are all made of fused silica.

11. The wafer-level assembly method according to claim 3, wherein
the plurality of micro hemispherical resonators, the plurality of planar electrode substrates and the wafer fixture are all made of fused silica.

12. The wafer-level assembly method according to claim 4, wherein
the plurality of micro hemispherical resonators, the plurality of planar electrode substrates and the wafer fixture are all made of fused silica.

13. The wafer-level assembly method according to claim 5, wherein the plurality of micro hemispherical resonators, the plurality of planar electrode substrates and the wafer fixture are all made of fused silica.

* * * * *